United States Patent
Hamade

(10) Patent No.: US 8,622,516 B2
(45) Date of Patent: Jan. 7, 2014

(54) INK JET RECORDING HEAD AND METHOD OF PRODUCING INK JET RECORDING HEAD

(75) Inventor: Yohei Hamade, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

(21) Appl. No.: 13/225,947

(22) Filed: Sep. 6, 2011

(65) Prior Publication Data

US 2012/0086750 A1    Apr. 12, 2012

(30) Foreign Application Priority Data

Oct. 7, 2010   (JP) ................... 2010-227493

(51) Int. Cl.
*B41J 2/14*    (2006.01)

(52) U.S. Cl.
USPC ............................................. 347/40; 347/47

(58) Field of Classification Search
CPC ..... B41J 2/1623; B41J 2/1621; B41J 2202/22
USPC .............................................. 347/20, 40, 47
See application file for complete search history.

(56) References Cited

U.S. PATENT DOCUMENTS

| | | | |
|---|---|---|---|
| 5,148,192 A * | 9/1992 | Izumida et al. ................. | 347/44 |
| 7,762,649 B2 | 7/2010 | Mukai et al. | |
| 2005/0130075 A1 | 6/2005 | Shaarawi et al. | |

FOREIGN PATENT DOCUMENTS

| | | |
|---|---|---|
| JP | 2007-514201 A | 5/2007 |
| JP | 2007-283720 A | 11/2007 |

* cited by examiner

*Primary Examiner* — Julian Huffman
*Assistant Examiner* — Sharon A Polk
(74) *Attorney, Agent, or Firm* — Fitzpatrick, Cella, Harper & Scinto

(57) ABSTRACT

Provided is an ink jet recording head, including multiple ejection orifices for ejecting droplets to a recording medium, in which a normal of a plane formed of the following straight lines is tilted with respect to an axis line of each of the ejection orifices: a straight line obtained by connecting points, which are positioned on peripheries of the respective ejection orifices and are at shortest distances from a face plane, in a longitudinal direction of an ejection orifice array; and a straight line obtained by connecting points, which are positioned on the peripheries of the respective ejection orifices and are at longest distances from the face plane, in the longitudinal direction of the ejection orifice array.

8 Claims, 3 Drawing Sheets

INK JET RECORDING HEAD AND METHOD OF PRODUCING INK JET RECORDING HEAD

BACKGROUND OF THE INVENTION

1. Field of the Invention

The present invention relates to an ink jet recording head capable of ejecting a droplet of ink or the like and a method of producing an ink jet recording head.

2. Description of the Related Art

An ink jet recording apparatus is generally formed of an ink jet recording head provided with multiple ejection orifices and a carriage for causing the ink jet recording head to scan the top of a recording medium. In addition, the apparatus performs recording by causing nozzles to eject ink droplets while moving the ink jet recording head on the recording medium.

In an ink jet recording mode, the ink droplets to be ejected from the nozzles are classified into a main droplet and a sub-droplet produced as a result of separation from the main droplet. The sub-droplet is a small ink droplet and ejected at a slow speed as compared with the main droplet. Accordingly, the sub-droplet generally impinges on a position on the recording medium different from that of the main droplet, and the difference may be responsible for a reduction in the quality of a recorded image.

In order that such a displacement between the positions on which the main droplet and the sub-droplet impinge may be suppressed to a low level, such an approach as described below has been conventionally adopted. A distance between an ejection orifice surface at which each ejection orifice of the ink jet recording head is positioned and the recording medium is shortened, or the speed at which a droplet is ejected is increased.

Meanwhile, Japanese Patent Application Laid-Open No. 2007-283720 discloses the following ink jet recording head. The directions in which a main droplet and a sub-droplet are ejected differ from each other in relation to a relative movement direction between an ink jet recording head and a recording medium. In an ink jet recording apparatus of Japanese Patent Application Laid-Open No. 2007-283720 described in the foregoing, the ink jet recording head is mounted at such a position as to be relatively movable with respect to the recording medium, and its ejection orifice surface is tilted toward the relative movement direction of the ink jet recording head with reference to the recording medium. The apparatus is characterized in that the direction in which the main droplet is ejected is tilted by the tilt so that a displacement between the positions on which the main droplet and the sub-droplet impinge may be suppressed.

In addition, Japanese Patent Translation Publication No. 2007-514201 discloses a method of reducing damage to the shape of a nozzle ejection orifice that occurs at the time of the wiping of ink, the method including forming a recess having a curved surface in a resin by photolithography and forming the ejection orifice in the curved surface.

SUMMARY OF THE INVENTION

In the ink jet recording head described in Japanese Patent Application Laid-Open No. 2007-283720 described above, a photosensitive resin material that is an organic substance is used as a material for forming a nozzle peripheral surface including an ejection orifice and its flow path. On the other hand, a material that occupies a large part of an ejection orifice portion such as a top board or a heater board is formed of an inorganic substance such as silicon, and hence the ejection orifice surface can be processed by polishing. However, the processing by polishing may be difficult in such an ink jet recording head that an ejection orifice surface is formed of a photosensitive resin material that is an organic substance and an ejection orifice of the surface is formed by employing a photolithography technique.

In addition, in an ink jet recording head described in Japanese Patent Translation Publication No. 2007-514201 described above, one ejection orifice is placed in each recess thus formed, and hence a distance between ejection orifices lengthens by the size of each recess. As a result, it may become difficult to array nozzles densely.

In view of the foregoing, an object of the present invention is as described below. The object is to provide the following ink jet recording head and a method of producing the ink jet recording head. In the ink jet recording head, ejection orifices can be densely formed by employing a photolithography technique. The ink jet recording head suppresses a displacement between the positions on which a main droplet and a sub-droplet impinge while achieving an increase in its recording speed, and hence can realize an improvement in the quality of an image.

In order to achieve the above-mentioned object, the present invention provides an ink jet recording head, including multiple ejection orifices for ejecting droplets to a recording medium, in which a normal of a plane formed of the following straight lines is tilted with respect to an axis line of each of the ejection orifices: a straight line obtained by connecting points, which are positioned on peripheries of the respective ejection orifices and are at shortest distances from a face plane, in a longitudinal direction of an ejection orifice array; and a straight line obtained by connecting points, which are positioned on the peripheries of the respective ejection orifices and are at longest distances from the face plane, in the longitudinal direction of the ejection orifice array.

According to the present invention, there is provided the following ink jet recording head and a method of producing the ink jet recording head. In the ink jet recording head, ejection orifices can be densely formed by employing a photolithography technique. The ink jet recording head suppresses a displacement between the positions on which a main droplet and a sub-droplet impinge while achieving an increase in its recording speed, and hence can realize an improvement in the quality of an image.

Further features of the present invention will become apparent from the following description of exemplary embodiments with reference to the attached drawings.

DESCRIPTION OF THE EMBODIMENTS

As described in Japanese Patent Application Laid-Open No. 2007-283720, upon recording on the recording medium with the ink jet recording head, the ink flies from an ejection orifice toward the recording medium while being separated into a main droplet and a sub-droplet by its surface tension. It should be noted that the ink jet recording head moves with respect to the recording medium to eject the liquid in an ink jet recording apparatus of each of a serial scan type and a full-line type.

Here, the term "serial scan type" refers to such a type that the ink jet recording head ejects the liquid while moving in a scanning direction. On the other hand, the term "full-line type" refers to such a type that the liquid is ejected from the ink jet recording head while recording media are continuously conveyed with the ink jet recording head fixed.

As described above, the ink jet recording head relatively moves in a direction parallel to the recording medium, and hence such main droplet and sub-droplet impinge on the recording medium so as to be displaced from each other in some cases.

According to the present invention, however, the following can be achieved even in the case of such an ink jet recording head that multiple ejection orifices are each formed of a cured product of a photosensitive resin material that is an organic substance.

Figure 3A:
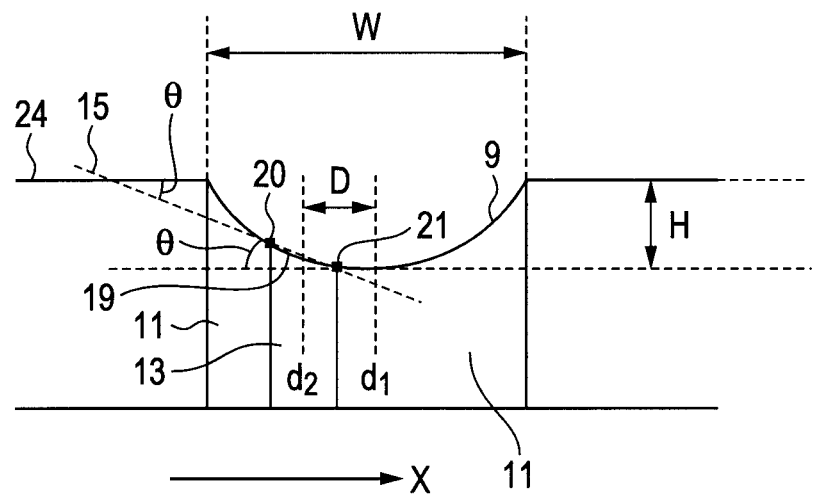
FIGS. 3A and 3B are each an explanatory diagram of the tilt angle of the normal of a plane including points, which are positioned on the periphery of an ejection orifice of the ink jet recording head according to the embodiment of the present invention and are closest to and most distant from a face plane, with respect to the axis line of the ejection orifice.
Figure 3B:
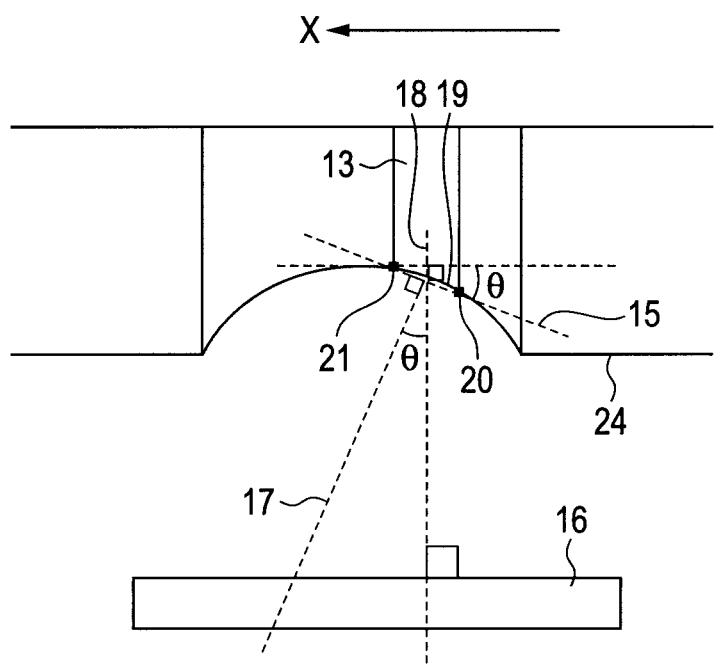

That is, as illustrated in FIG. 3B, a normal 17 of a plane 15 is tilted with respect to the axis line of each ejection orifice. The normal is particularly preferably tilted to the side of the movement direction of the ink jet recording head (relative movement direction, X direction). Although one ejection orifice out of the multiple ejection orifices is illustrated in FIG. 3B, the normal 17 is tilted to the side of the X direction, that is, toward the X direction with respect to the axis line of each ejection orifice of the multiple ejection orifices.

Figure 1:
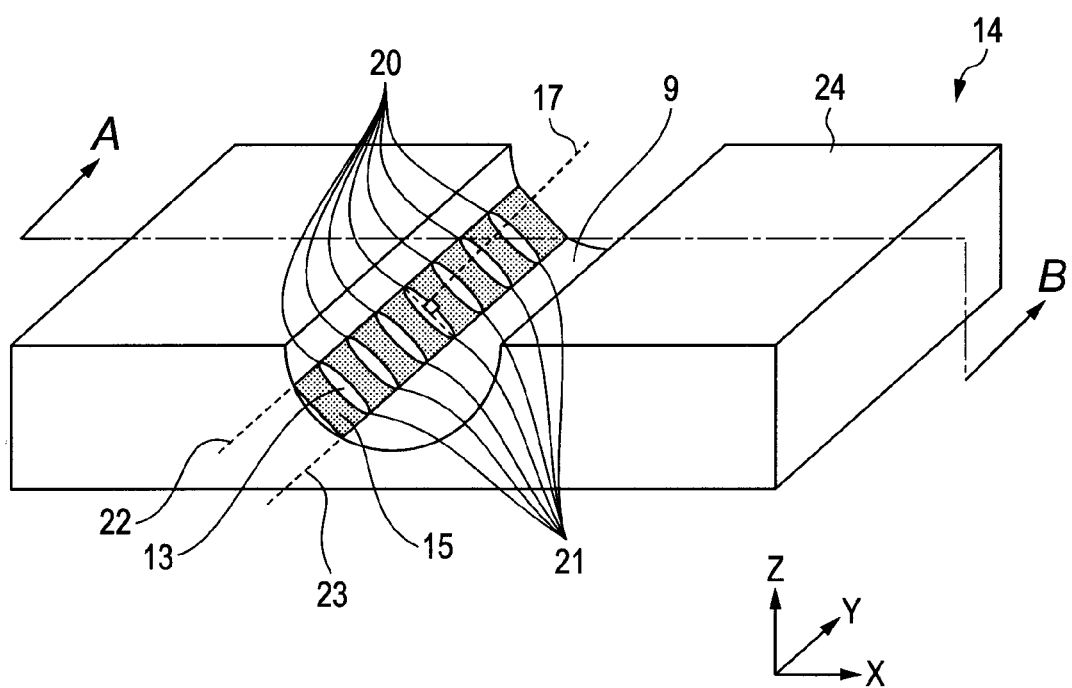
FIG. 1 is a perspective view of an ink jet recording head according to an embodiment of the present invention.

It should be noted that the plane 15 includes a point 20 which is positioned on the periphery of each ejection orifice 13 and is at the shortest distance from a face plane 24, and a point 21 which is positioned thereon and is at the longest distance therefrom. In addition, as illustrated in FIG. 1, the plane 15 is a plane formed of a straight line 22 obtained by connecting the points 20 in the longitudinal direction of an ejection orifice array and a straight line 23 obtained by connecting the points 21 in the longitudinal direction of the ejection orifice array.

It should be noted that the term "on the periphery of an ejection orifice" means any position on the periphery of a figure (such as an ellipse) formed by each ejection orifice 13 in a tilted surface of a recess 9. The periphery of each ejection orifice can be a boundary portion between a cured product 14 of the photosensitive resin material and the ejection orifice 13 in the tilted surface, and can be the edge of the ejection orifice 13. It should be noted that the recess 9 is formed in the face plane 24.

In addition, the face plane 24 means the front surface of the cured product 14 of the photosensitive resin material (which is a surface opposite to a surface on a substrate side (rear surface) and refers to the front surface of a cured product of a water-repellent layer-forming material layer 5 in FIGS. 2A to 2H), and does not include the inner surface of the recess 9.

The multiple ejection orifices are typically arrayed on a straight line in the tilted surface of the recess 9, and the term "ejection orifice array" typically means such an array that the respective ejection orifices are arranged on a straight line.

In addition, the longitudinal direction of the ejection orifice array can be the direction in which the multiple ejection orifices are arrayed, and means a Y direction in which the ejection orifices are arranged in FIG. 1.

It should be noted that the ejection orifices 13 are typically formed as through-holes that penetrate the cured product of the photosensitive resin material (photosensitive resin layer) perpendicularly to a recording medium 16 as illustrated in FIGS. 2A to 2H, 3A and 3B. Accordingly, the axis line of each ejection orifice is a straight line passing the central axis of the ejection orifice extending in the direction perpendicular to the recording medium (Z direction).

Thus, the directions in which the main droplet and the sub-droplet are ejected can be made different from each other at the time of printing depending on the movement direction (relative movement direction) of the ink jet recording head with respect to the recording medium. As a result, the displacement between the positions on which the main droplet and the sub-droplet impinge can be suppressed, and hence a high-quality image can be formed. It should be noted that the term "main droplet" refers to droplets which are ejected mainly from ejection orifices, have a uniform diameter, and are relatively large as compared with sub-droplets. The term "sub-droplet" refers to a relatively small droplet formed as a result of separation from the main droplet when a droplet flies from a nozzle.

It should be noted that the multiple ejection orifices 13 are typically produced in such a manner that the points 20 and 21 form the straight lines 22 and 23 parallel to each other, respectively, and the straight lines form the plane 15 as illustrated in FIG. 1. In addition, each of the multiple ejection orifices 13 is typically formed by the recess in the direction perpendicular to the recording medium (Z direction) as illustrated in each of FIGS. 3A and 3B, and these ejection orifices are regularly placed in the tilted surface of the recess 9.

In Japanese Patent Application Laid-Open No. 2007-283720, the photosensitive resin material was used only as a material for forming a nozzle peripheral surface including an ejection orifice of the ink jet recording head and its flow path. In the present invention, however, an ejection orifice is formed in the photosensitive resin layer, and hence any portion other than a nozzle peripheral surface is also formed of the photosensitive resin material.

An ink jet recording head of the present invention can eject a droplet of ink or the like, and can be used by being mounted on an ink jet recording apparatus. At that time, the ink jet recording head is mounted at such a position as to be relatively movable with respect to a recording medium. It should be noted that θ in each of FIGS. 3A and 3B represents the tilt angle of the normal 17 of the plane 15 with respect to an axis line 18 of an ejection orifice when the normal 17 is tilted toward the relative movement direction, and the tilt angle θ is 0° when the normal 17 is parallel to the axis line 18. The tilt angle θ can be set in consideration of, for example, a relative movement speed between the recording medium and the ink jet recording head upon printing. However, the tilt angle θ is preferably set to 80° or less because it may be unable to form a meniscus well when the tilt angle θ is extremely large.

Described in detail is the process in which a recess having a surface tilted with respect to the surface of a photosensitive resin layer is formed in the photosensitive resin layer in an ink jet recording head, and ejection orifices are formed in the tilted side surface of the recess. It should be noted that as illustrated in FIG. 3A, the tilt angle of the tilted side surface with respect to the front surface of the photosensitive resin layer in the portion at which the ejection orifices are positioned out of the tilted side surface, more specifically the tilt angle of the plane 15 with respect to the face plane 24 is θ.

FIG. 1 is a perspective view of an ink jet recording head according to an embodiment of the present invention. In the ink jet recording head, the recess 9 having a tilted surface is formed in the cured product 14 of the photosensitive resin material provided on a substrate, and the multiple ejection orifices 13 are formed in the tilted surface. The surface of the ink jet recording head can be made water-repellent as required. The surface of the ink jet recording head can be provided with water repellency by, for example, forming two photosensitive resin layers and turning the layer on the surface side out of the two layers into a water-repellent layer. As described above, one photosensitive resin layer may be formed, or two or more photosensitive resin layers may be formed. When two or more photosensitive resin layers are formed, the respective layers may be different from or identical to each other in composition.

The ink jet recording head of FIG. 1 is such that the grooved recess 9 along the Y direction is formed and the ejection orifices 13 are formed along the tilted surface of the recess. In the figure, the X direction represents the movement direction (relative movement direction) of the ink jet recording head with respect to a recording medium upon recording on the recording medium, the Y direction represents the direction in which the ejection orifices are arrayed, and the Z direction represents a direction perpendicular to the recording medium. It should be noted that the term "grooved" refers to such a shape of the recess that the width and depth of the recess uniformly extend along the longitudinal direction of the ejection orifice array (the Y direction in FIG. 1).

A production method of the present invention involving forming the ejection orifices 13 in the tilted surface of the recess 9 is described with reference to sectional views each taken along the line A-B of FIG. 1 (FIGS. 2A to 2H) by paying attention to one ejection orifice out of the multiple ejection orifices 13. First of all, the formation of the ground of the photosensitive resin layer in which the ejection orifices are formed is described.

Figure 2A:
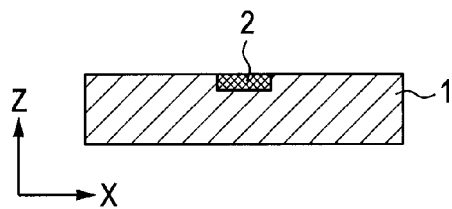
FIGS. 2A, 2B, 2C, 2D, 2E, 2F, 2G and 2H are diagrams illustrating the respective steps of a method of producing the ink jet recording head according to the embodiment of the present invention.
Figure 2E:
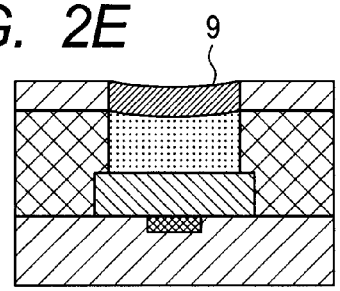
Figure 2B:
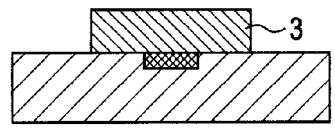

First, an ink flow path-forming material layer 3 serving as a mold of an ink flow path that communicates with the ejection orifice 13 is formed on a substrate 1 (FIG. 2A) provided with an energy-generating element 2 that generates energy for ejecting ink (FIG. 2B). It should be noted that the ink flow path-forming material layer 3 is preferably produced with a positive photosensitive resin material because the mold of the ink flow path is to be removed by dissolution later. Specific examples of the positive photosensitive resin material include vinyl ketone-based, photo-degradable polymer compounds such as polymethyl isopropenyl ketone and polyvinyl ketone.

Figure 2F:
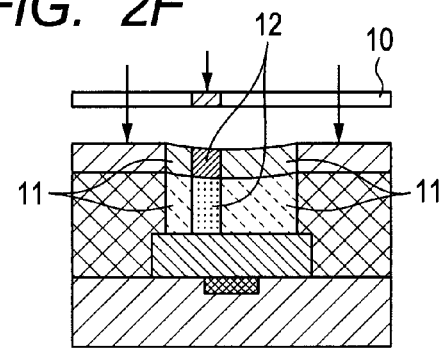
Figure 2C:
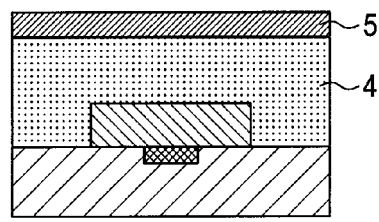

Next, a photosensitive resin layer 4 serving as a first photosensitive resin layer in which an ejection orifice is to be formed is formed on the ink flow path-forming material layer 3 (FIG. 2C). The photosensitive resin layer 4 can be formed by applying a photosensitive resin material by a general-purpose application method such as a spin coating method, a slit coating method, or a roll coating method.

Here, a cationic polymerization type photo-curable resin material is preferably used as the photosensitive resin material. In addition, a high mechanical strength and strong adhesiveness with the ground are requested of the photosensitive resin layer, and hence a cationic polymerization type photo-curable resin material containing an epoxy resin having these characteristics is particularly suitably used.

It should be noted that the content of the epoxy resin in the cationic polymerization type photo-curable resin material is preferably set to 20 mass % or more. When the content of the epoxy resin is 20 mass % or more, the thickness of the photosensitive resin layer can be easily prevented from becoming small, and hence a moderate thickness for the formation of an ejection orifice can be easily obtained. In addition, an upper limit for the content of the epoxy resin can be appropriately determined depending on the amounts of additives such as a polymerization initiator and an adhesiveness improver.

Examples of the above-mentioned epoxy resin include a bisphenol A type epoxy resin, a novolac type epoxy resin, a resin material available under the trade name "SU8" from Nippon Kayaku Co., Ltd., and a resin material available under the trade name "EHPE3150" from Daicel Chemical Industries Limited.

In addition, the epoxy equivalent of the epoxy resin is preferably 2,000 or less, more preferably 1,000 or less. This is because of the following reason. When the epoxy equivalent of the epoxy resin is 2,000 or less, a reduction in crosslink density during the curing reaction of the photosensitive resin material can be easily prevented, and hence a reduction in the glass transition temperature of the cured product of the photosensitive resin material and a reduction in its adhesiveness can be easily prevented. It should be noted that the epoxy equivalent is defined as the molecular weight of the epoxy resin per one epoxy group.

In addition, an epoxy resin that is solid at normal temperature is preferably used in the photosensitive resin layer from such a viewpoint that a reduction in resolution due to high flowability of a coated film is easily prevented. It should be noted that the term "normal temperature" as used herein refers to a temperature state in the range of 20° C.±15° C., in other words, the range of 5° C. or more and 35° C. or less as specified in the Japanese Industrial Standard (JIS Z 8703). It should be noted that the phrase "solid at normal temperature" refers to a substance whose melting point is a temperature higher than 35° C.

In addition, the cationic polymerization type photo-curable resin material preferably contains the above-mentioned epoxy resin and a photocationic polymerization initiator for curing the epoxy resin. Examples of the photocationic polymerization initiator include an aromatic iodonium salt and an aromatic sulfonium salt, and multiple photocationic polymerization initiators can be used in combination.

It should be noted that examples of the aromatic iodonium salt include products available under the trade names "DPI-105," and "MPI-103 and 105" from Midori Kagaku Co., Ltd. Examples of the aromatic sulfonium salt include products each available under the trade name "ADEKA OPTOMER SP-170 or SP-172" from ADEKA CORPORATION.

Further, a reducing agent can be used in combination with the above-mentioned photocationic polymerization initiator, and cationic polymerization can be additionally promoted by heating. Copper triflate is suitably used as the above-mentioned reducing agent in consideration of its reactivity and solubility in the epoxy resin.

Next, the water-repellent layer-forming material layer 5 serving as a second photosensitive resin layer is formed on the photosensitive resin layer 4 for imparting water repellency to the surface of the ink jet recording head (FIG. 2C). The water-repellent layer-forming material layer 5 can be formed by applying a photosensitive resin material by a general-purpose application method such as a spin coating method, a slit coating method, or a roll coating method.

A water-repellent layer is requested to have water repellency against ink and a high mechanical strength against a wiping involving contact with, for example, a wiper. Accordingly, a negative photosensitive resin material containing a functional group having water repellency such as fluorine or silicon is suitably used in the water-repellent layer-forming material layer 5 for forming the water-repellent layer. A condensation product made from a hydrolyzable silane compound having a fluorine-containing group and a hydrolyzable silane compound having a cationic polymerizable group is also suitably used in the water-repellent layer-forming material layer 5. When any such negative photosensitive resin material is used in the water-repellent layer-forming material layer 5, the layer can be subjected to patterning and curing together with the photosensitive resin layer 4 at once.

Further, the photosensitive resin layer 4 and the water-repellent layer-forming material layer 5 are exposed to light through a mask 8. At that time, a first portion 6 was exposed to light to serve as an exposed portion, and a second portion 7 as a portion corresponding to the recess 9 was not exposed to light so as to serve as a non-exposed portion (FIG. 2D).

Here, with regard to the energy of an electromagnetic wave radiated in the exposing step, a proper electromagnetic wave can be selected in accordance with the photosensitive regions of the photosensitive resin materials used in the photosensitive resin layer 4 and the water-repellent layer-forming material layer 5.

In addition, a dose in the exposing step can be empirically determined in accordance with, for example, the photosensitive resin materials used in the layers 4 and 5, and the shape and depth of the recess. It should be noted that the shape and depth of the recess 9 depend on a pattern width W in the X direction of the second portion 7 as a non-exposed portion as well. It should be noted that the pattern width W is preferably set to 20 µm or more and 200 µm or less. The depth of the recess (H illustrated in FIG. 3A) is preferably set to be equal to or less than the thickness of the photosensitive resin layer 4. It should be noted that arrows in FIG. 2D and FIG. 2F to be described later each represent the electromagnetic wave applied through the mask.

Crosslinking is caused by an acid, which is generated from the aromatic iodonium salt or the like upon exposure, in the first portion 6 as an exposed portion in the step of baking the layers 4 and 5 (FIG. 2E). As the exposed portion where the crosslinking occurs and the non-exposed portion fuse with each other at their interface, an unreacted component in the non-exposed portion moves toward the exposed portion, and hence the grooved recess 9 is formed in the surface of the non-exposed portion. The presence of the recess can reduce damage to the shape of a nozzle ejection orifice that occurs at the time of, for example, the wiping of the ink on the face plane.

Here, a proper baking temperature for forming the recess is preferably higher than the glass transition temperature or melting point of the photosensitive resin material of the non-exposed portion 7 so that the resin material of the non-exposed portion can sufficiently move. When two or more photosensitive resin layers are formed, baking is preferably performed at a temperature higher than the glass transition temperatures or melting points of the photosensitive materials of the non-exposed portions of all the photosensitive resin layers.

For example, in FIGS. 2A to 2H, the baking is preferably performed at a temperature higher than the glass transition temperature or melting point of the non-exposed portion of each of the two photosensitive resin material layers (represented by reference numerals 4 and 5). In addition, the baking is more preferably performed at a temperature in the range of 80° C. or more and 120° C. or less in order that the generation of a stress in each resin material due to heat may be easily prevented.

Alternatively, a low-molecular weight component having a glass transition temperature or melting point lower than that of the photosensitive resin material of the non-exposed portion 7 may be added to the photosensitive resin layer. For example, an alicyclic epoxy such as a CELLOXIDE 2021P or CELLOXIDE 2000 (trade name, Daicel Chemical Industries Limited.) or an epoxy compound A-187 (trade name, Momentive Performance Materials Inc.) to be described later may be added to the photosensitive resin layer.

Here, a distance between ejection orifices is preferably as short as possible in order that high-density printing may be performed. Accordingly, the shape of the recess 9 is preferably such that the recess extends in a groove fashion in the Y-axis direction.

Next, a method of forming the ejection orifice 13 in the tilted surface of the recess 9 formed in the surface of each of the two photosensitive resin layers in this embodiment is described.

As illustrated in FIG. 3A, the recess 9 has a tilted surface in each of the relative movement direction of the ink jet recording head with respect to the recording medium upon recording (X direction) and the direction opposite to the relative movement direction (−X direction) with the deepest portion of the recess (a center $d_1$ of the recess in FIG. 3A) as a boundary. In addition, exposure is performed through a mask 10 in such a manner that a fourth portion 12 in each of the layers 4 and 5 serves as a non-exposed portion and a third portion 11 in each of the layers serves as an exposed portion so that the ejection orifice 13 may be positioned at the tilted surface in the opposite direction (FIG. 2F).

Next, the layers 4 and 5 are subjected to baking (FIG. 2G) and development so that the fourth portion 12 as a non-exposed portion may be removed. Thus, the ejection orifice 13 is formed in the tilted surface of the recess 9 (FIG. 2H). It should be noted that incident light is refracted at the interface of the recess 9 formed between air, and each of the layers 4 and 5 upon exposure owing to a difference in refractive index for the light therebetween. However, there is no need to take the influences of the refraction on the ejection orifice and the shape of a nozzle into consideration because the tilt of the recess is shallow. Reference numeral 19 represents the surface of the ejection orifice.

Figure 2G:
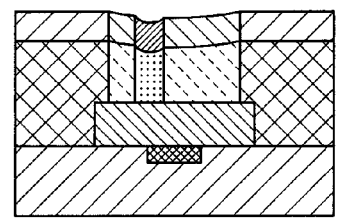
Figure 2D:
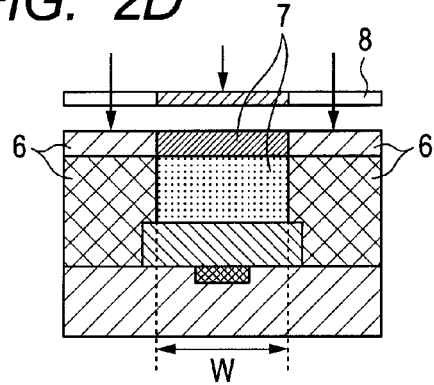
Figure 2H:
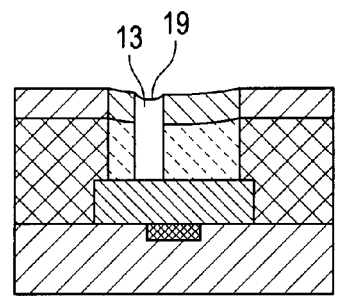

In addition, the exposing step and baking step of FIGS. 2F and 2G may be performed under the same conditions as those of the steps of FIGS. 2D and 2E.

In the developing step, the development is performed with a solvent suitable for the photosensitive resin material used in each of the layers 4 and 5.

Finally, the ink flow path-forming material layer is developed with a solvent suitable for the photosensitive resin material used in the material layer 3 so that an ink flow path that communicates with the ejection orifice 13 may be formed. After that, the ink jet recording head may be produced by promoting curing with light, heat, or the like as required.

EXAMPLES 1 TO 8

Hereinafter, an exemplary embodiment of the present invention is described in detail.

An ink jet recording head was produced by employing the steps of FIGS. 2A to 2H. As illustrated in FIG. 2A, polymethyl isopropenyl ketone as a photosensitive resin material (manufactured by TOKYO OHKA KOGYO Co., Ltd., trade name: ODUR-1010) was applied onto the substrate 1 (FIG. 2A) provided with the energy-generating element 2 so as to have a thickness of 14 µm. Next, the ink flow path-forming material layer 3 serving as a mold of an ink flow path was formed with an exposing apparatus UX3000 (trade name, Ushio Inc.) (FIG. 2B).

Next, as illustrated in FIG. 2C, a cationic polymerization type photo-curable resin material having the composition illustrated in Table 1 was applied onto the mold of an ink flow path from the surface of the substrate (surface of the substrate 1 on the side where a photosensitive resin layer was to be provided) so as to have a thickness of 25 µm, and was then heat-treated at 60° C. for 9 minutes. Thus, the photosensitive resin layer 4 as a first photosensitive resin layer in which an ejection orifice was to be formed was formed.

It should be noted that a specification for the epoxy equivalent of the epoxy resin used is 170 to 190. Further, a cured condensation product was diluted with 2-butanol and ethanol so that a solid matter ratio became 7 mass %, and then the resultant was applied onto the photosensitive resin layer 4. It should be noted that the cured condensation product is a compound made from glycidoxypropyltriethoxysilane, methyltriethoxysilane, and tridecafluoro-1,1,2,2-tetrahydrooctyltriethoxysilane.

Next, the resultant was heat-treated at 70° C. for 3 minutes so that the diluent solvents were volatilized. Thus, the water-repellent layer-forming material layer 5 as a second photosensitive resin layer was formed (FIG. 2C).

TABLE 1

| Epoxy resin | Trade name: EHPE-3510, Daicel Chemical Industries Limited. | 100 parts by mass |
| Additive | 1,4-HFAB, Central Glass Co., Ltd. | 20 parts by mass |
| Photocationic polymerization initiator | Trade name: SP-172, ADEKA OPTOMER | 6 parts by mass |
| Silane coupling agent | Trade name: A-187, Momentive Performance Materials Inc. | 5 parts by mass |
| Solvent | Xylene, KISHIDA CHEMICAL Co., Ltd. | 70 parts by mass |

1,4-HFAB: 1,4-Bis(hexafluoro-2-hydroxy-2-propyl)benzene

Next, as illustrated in FIG. 2D, exposure was performed by using an I-ray exposure stepper (manufactured by Canon Inc.) through the first photomask 8 with radiant energy with a relatively low dose of 250 mJ/cm$^2$ so that the second portion 7 served as a non-exposed portion. At this time, the pattern width W in the X direction of the non-exposed portion is as illustrated in Table 2. Further, the resultant was heat-treated at a temperature illustrated in Table 2 for 4 minutes so that the recess 9 was formed (FIG. 2E). The depth of the recess thus produced was measured from an SEM photograph of a recess section observed from the Y direction as a direction perpendicular to the relative movement direction (X direction). Thus, it was confirmed that the recess having a depth H illustrated in Table 2 was obtained.

Next, exposure was performed by using an I-ray exposure stepper (manufactured by Canon Inc.) through the second photomask 10 at 350 mJ/cm$^2$ so that the diameter of the ejection orifice became 16 µm (FIG. 2F). At this time, the position of the ejection orifice was set so that a distance D from the center $d_1$ of the recess (corresponding to the deepest portion) to a central axis $d_2$ of the ejection orifice (corresponding to the axis line 18 of the ejection orifice) as illustrated in FIG. 3A took a value illustrated in Table 2. It should be noted that the distance D is preferably set to be longer than 0 µm and equal to or shorter than W/2 so that the ejection orifice may be positioned at the tilted surface of the recess, though the preferred value varies depending on the diameter of the ejection orifice.

Further, the resultant was heat-treated at 90° C. for 4 minutes (FIG. 2G). After that, the treated product was developed with a mixed solvent containing xylene and methyl isobutyl ketone at a mass ratio of 6/4 so that the ejection orifice 13 was formed (FIG. 2H).

Next, a mask (not shown) for producing an ink supply port was properly placed on the back surface of the substrate 1 (surface opposite to the surface having the photosensitive resin layers), and then the surface of the substrate 1 was protected with a rubber membrane (not shown). After that, an ink supply port (not shown) was produced by the anisotropic etching of the silicon substrate. After the completion of the anisotropic etching, the rubber membrane was removed, and then the entire surface was irradiated with ultraviolet light by using a UX3000 (trade name, Ushio Inc.) again so that the ink flow path-forming material layer 3 was decomposed. Then, the ink flow path-forming material layer 3 was removed by dissolution with methyl lactate. After a heating process had been performed at 200° C. for 1 hour for additionally curing the photosensitive resin layer 4 and the water-repellent layer-forming material layer 5, electrical connection and ink-supplying means were appropriately placed. Thus, the ink jet recording head was obtained.

Table 2 illustrates the pattern width W in the X direction of the non-exposed portion in FIG. 2D, baking conditions for forming the recess in FIG. 2E, the depth H of the formed recess, and the displacement D of the ejection orifice from the center of the recess (corresponding to the deepest portion) illustrated in FIGS. 3A and 3B. The tilt angle θ of the normal of the plane 15 with respect to the axis line of each ejection orifice was measured from an SEM photograph of an ejection orifice section. Thus, it was confirmed that the ejection orifices each tilted at an angle illustrated in Table 2 were obtained.

In addition, it was shown that in each of (Examples 1 to 8), the position on which a sub-droplet impinged fell within the position on which a main droplet impinged and hence printing was satisfactory.

TABLE 2

| Example | Pattern Width W of non-exposed portion/µm | Baking temperature/° C. | Depth H of recess/µm | Displacement D of ejection orifice from center of recess/µm | Tilt angle θ of normal of plane 15/° |
|---|---|---|---|---|---|
| 1 | 50 | 100 | 3.8 | 12.5 | 9 |
| 2 | 75 | 80 | 1.2 | 18.8 | 2 |
| 3 | 75 | 100 | 3.2 | 8.0 | 2 |
| 4 | 75 | 100 | 3.2 | 18.8 | 5 |
| 5 | 75 | 100 | 3.2 | 25.0 | 6 |
| 6 | 75 | 120 | 4.0 | 18.8 | 6 |
| 7 | 100 | 100 | 2.3 | 25.0 | 3 |
| 8 | 100 | 120 | 3.7 | 25.0 | 4 |

According to the present invention, provided is the following ink jet recording head. In the ink jet recording head, ejection orifices can be densely formed by employing a photolithography technique. The ink jet recording head suppresses a displacement between the positions on which a main droplet and a sub-droplet impinge while achieving an increase in its recording speed, and hence can realize an improvement in the quality of an image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-227493, filed Oct. 7, 2010, which is hereby incorporated by reference herein in its entirety.

What is claimed is:

1. An ink jet recording head, comprising multiple ejection orifices for ejecting droplets to a recording medium, wherein a normal of a plane formed of the following straight lines is tilted with respect to an axis line of each of the ejection orifices:
   a straight line obtained by connecting points, which are positioned on peripheries of the respective ejection orifices and are at shortest distances from a face plane, in a longitudinal direction of an ejection orifice array; and
   a straight line obtained by connecting points, which are positioned on the peripheries of the respective ejection orifices and are at longest distances from the face plane, in the longitudinal direction of the ejection orifice array.

2. An ink jet recording head according to claim 1, wherein the tilt of the normal comprises a tilt toward a movement direction of the ink jet recording head.

3. A method of producing an ink jet recording head comprising:
   applying a photosensitive resin material onto a substrate to form a photosensitive resin layer;
   forming, in the photosensitive resin layer, a recess having a surface tilted with respect to a surface of the photosensitive resin layer;
   forming the multiple ejection orifices in the tilted surface wherein the surface is tilted such that:
      a normal of a plane formed of the following straight lines is tilted with respect to an axis line of each of ejection orifices for ejecting droplets:
      a straight line obtained by connecting points, which are positioned on peripheries of the respective ejection orifices and are at shortest distances from a face plane, in a longitudinal direction of an ejection orifice array, and
      a straight line obtained by connecting points, which are positioned on the peripheries of the respective ejection orifices and are at longest distances from the face plane, in the longitudinal direction of the ejection orifice array.

4. A method of producing an ink jet recording head according to claim 3, wherein the photosensitive resin material comprises a cationic polymerization type photo-curable resin material.

5. A method of producing an ink jet recording head according to claim 4, wherein the cationic polymerization type photo-curable resin material contains an epoxy resin having an epoxy equivalent of 2,000 or less, and at least one photo-cationic polymerization initiator selected from the group consisting of an aromatic iodonium salt and an aromatic sulfonium salt.

6. A method of producing an ink jet recording head according to claim 3, wherein:
   the forming of the recess having the tilted surface in the photosensitive resin layer includes:
      exposing the photosensitive resin layer to light through a mask while causing a portion corresponding to the recess to serve as a non-exposed portion and
      baking the photosensitive resin layer obtained by the exposing; and
   the forming of the recess is carried out by the baking of the photosensitive resin layer including baking the photosensitive resin layer at a temperature higher than one of a glass transition temperature and a melting point of the photosensitive resin layer of the non-exposed portion.

7. A method of producing an ink jet recording head according to claim 3, wherein the recess comprises a grooved recess formed along the longitudinal direction of the ejection orifice array.

8. A method of producing an ink jet recording head according to claim 3, wherein:
   the recess has the tilted surface in each of a movement direction of a ink jet recording head with respect to the recording medium and a direction opposite to the movement direction with a deepest portion of the recess as a boundary; and
   the multiple ejection orifices are provided for the surface in the opposite direction.

* * * * *